US011862499B2

(12) United States Patent
Shang et al.

(10) Patent No.: US 11,862,499 B2
(45) Date of Patent: Jan. 2, 2024

(54) MULTIPLEXING CONTROL OF MULTIPLE POSITIONAL SENSORS IN DEVICE MANUFACTURING MACHINES

(71) Applicant: Applied Materials, Inc., Santa Clara, CA (US)

(72) Inventors: Kiyki-Shiy Shang, Mountain House, CA (US); Mikhail Taraboukhine, Pleasanton, CA (US); Venkata Raghavaiah Chowdhary Kode, Pflugerville, TX (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 16/947,822

(22) Filed: Aug. 19, 2020

(65) Prior Publication Data

US 2022/0055219 A1 Feb. 24, 2022

(51) Int. Cl.
| | |
|---|---|
| *H01L 21/68* | (2006.01) |
| *B25J 9/16* | (2006.01) |
| *B25J 13/08* | (2006.01) |
| *G01B 11/27* | (2006.01) |
| *G01B 11/00* | (2006.01) |
| *B25J 11/00* | (2006.01) |
| *H01L 21/67* | (2006.01) |

(52) U.S. Cl.
CPC .......... *H01L 21/681* (2013.01); *B25J 9/1694* (2013.01); *B25J 11/0095* (2013.01);
(Continued)

(58) Field of Classification Search
CPC .... B25J 9/1694; B25J 11/0095; B25J 13/088; G01B 11/002; G01B 11/272;
(Continued)

(56) References Cited

U.S. PATENT DOCUMENTS 5,980,194 A * 11/1999 Freerks .................. H01L 21/68
414/754
6,298,280 B1 * 10/2001 Bonora ................. H01L 21/681
700/218

(Continued)

FOREIGN PATENT DOCUMENTS

| KR | 20080042416 A | | 5/2008 | |
| KR | 1020090063275 | * | 1/2011 | ............. H01L 31/16 |
| KR | 20200070671 A | | 6/2020 | |

OTHER PUBLICATIONS

International Search Report and Written Opinion dated Dec. 6, 2021, on application No. PCT/US2021/046550.

*Primary Examiner* — Michael P LaPage
(74) *Attorney, Agent, or Firm* — Lowenstein Sandler LLP

(57) ABSTRACT

Implementations disclosed describe an integrated sensor controller comprising a sensor circuit and a logic circuit. The sensor circuit includes a light source driver to generate a driving signal, a demultiplexer to produce, using the driving signal, a plurality of output driving signals to be delivered to one of a plurality of sensors, and an amplifier to: receive a first signal from a first sensor, the first signal being associated with a first event representative of a position of a substrate within a device manufacturing machine, and generate a second signal. The sensor circuit further includes an analog-to-digital converter to receive the second signal and generate a third signal. The logic circuit includes a memory device and a processing device coupled to the memory device, the processing device to obtain based on the third signal, information about the position of the substrate.

21 Claims, 5 Drawing Sheets

(52) U.S. Cl.
CPC ........... *B25J 13/088* (2013.01); *G01B 11/002* (2013.01); *G01B 11/272* (2013.01); *H01L 21/67259* (2013.01)

(58) Field of Classification Search
CPC ......... H01L 21/67259; H01L 21/67201; H01L 21/681; G05B 2219/37286
See application file for complete search history.

(56) References Cited

U.S. PATENT DOCUMENTS

| | | | |
|---|---|---|---|
| 6,856,858 B2* | 2/2005 | Kurita | H01L 21/67236 700/218 |
| 7,458,763 B2* | 12/2008 | van der Meulen | H01L 21/67742 414/217 |
| 8,602,716 B2* | 12/2013 | van der Meulen | H01L 21/6719 414/805 |
| 2001/0030299 A1* | 10/2001 | Shiraishi | G03F 9/7088 250/559.29 |
| 2003/0130761 A1* | 7/2003 | Schauer | H01L 21/67265 700/213 |
| 2003/0139829 A1* | 7/2003 | Hausschmid | G01D 18/001 700/56 |
| 2005/0105991 A1* | 5/2005 | Hofmeister | H01L 21/67724 414/217 |
| 2017/0330876 A1* | 11/2017 | Leedy | H01L 27/11807 |
| 2019/0137253 A1* | 5/2019 | Trenholm | G01B 9/02091 |
| 2020/0026177 A1 | 1/2020 | Moradian et al. | |
| 2020/0110390 A1 | 4/2020 | Banna | |
| 2020/0163159 A1 | 5/2020 | Parkhe | |
| 2022/0381943 A1 | 12/2022 | Syvenkyy | |
| 2023/0001588 A1* | 1/2023 | Morita | B25J 9/101 |

* cited by examiner

MULTIPLEXING CONTROL OF MULTIPLE POSITIONAL SENSORS IN DEVICE MANUFACTURING MACHINES

TECHNICAL FIELD

This instant specification generally relates to controlling quality of substrate yield of systems used in electronic device manufacturing, such as various processing chambers. More specifically, the instant specification relates to accurate detection of substrate placement while the substrates are being transported by a robot blade to various destinations in device manufacturing machines.

BACKGROUND

Manufacturing of modern materials often involves various deposition techniques, such as chemical vapor deposition (CVD) or physical vapor deposition (PVD) techniques, in which atoms of one or more selected types are deposited on a substrate held in low or high vacuum environments that are provided by vacuum processing (e.g., deposition, etching, etc.) chambers. Materials manufactured in this manner may include monocrystals, semiconductor films, fine coatings, and numerous other substances used in practical applications, such as electronic device manufacturing. Many of these applications depend on the purity of the materials grown in the processing chambers. The advantage of maintaining isolation of the inter-chamber environment and of minimizing its exposure to ambient atmosphere and contaminants therein gives rise to various robotic techniques of sample manipulation and chamber inspection. Improving precision, reliability, and efficiency of such robotic techniques presents a number of technological challenges for continuing progress of electronic device manufacturing. This is especially pertinent given that the demands to the quality of chamber manufacturing products are constantly increasing.

SUMMARY

In one implementation, disclosed is a sensor controller that includes a sensor circuit and a logic circuit. The sensor circuit includes a light source driver to generate a driving signal, a demultiplexer to produce, using the driving signal, a plurality of output driving signals, wherein each of the plurality of output driving signals is to be delivered to one of a plurality of sensors. The sensor circuit further includes an amplifier coupled to each of the plurality of sensors, to: receive a first signal from a first sensor of the plurality of sensors, wherein the first signal is associated with a first event representative of a position of a substrate within a device manufacturing machine, and generate, based on the received first signal, a second signal. The sensor circuit further includes an analog-to-digital converter to receive the second signal and generate, based on the second signal, a third signal. The logic circuit includes a memory device storing instructions and a processing device coupled to the memory device, wherein the processing device is to obtain, using the stored instructions and based on the third signal, information about the position of the substrate.

In another implementation, disclosed is a method that includes generating, by a light source driver, a driving signal, producing, by a demultiplexer and using the driving signal, a plurality of output driving signals, and delivering each of the plurality of output driving signals to a respective one of a plurality of sensor. The method further includes receiving, by an amplifier, from a first sensor of the plurality of sensors, a first signal associated with an event representative of a position of a substrate within a device manufacturing machine, and generating, by the amplifier and based on the received first signal, a second signal. The method further includes receiving, by an analog-to-digital converter, the second signal, generating, by the analog-to-digital converter and based on the second signal, a third signal, and obtaining, by a processing device and based on the third signal, information about the position of the substrate.

In another implementation, disclosed is non-transitory computer readable medium storing instructions thereon that when executed by a processing device cause a sensor controller to generate, by a light source driver, a driving signal, produce, by a demultiplexer and using the driving signal, a plurality of output driving signals, and deliver each of the plurality of output driving signals to a respective one of a plurality of sensors. The instruction are further to cause the sensor controller to receive, by an amplifier, from a first sensor of the plurality of sensors, a first signal associated with an event representative of a position of a substrate within a device manufacturing machine, and generate, by the amplifier and based on the received first signal, a second signal. The instruction are further to cause the sensor controller to receive, by an analog-to-digital converter, the second signal, generate, by the analog-to-digital converter, based on the second signal, a third signal, and obtain, based on the third signal, information about the position of the substrate.

DETAILED DESCRIPTION

Figure 1:
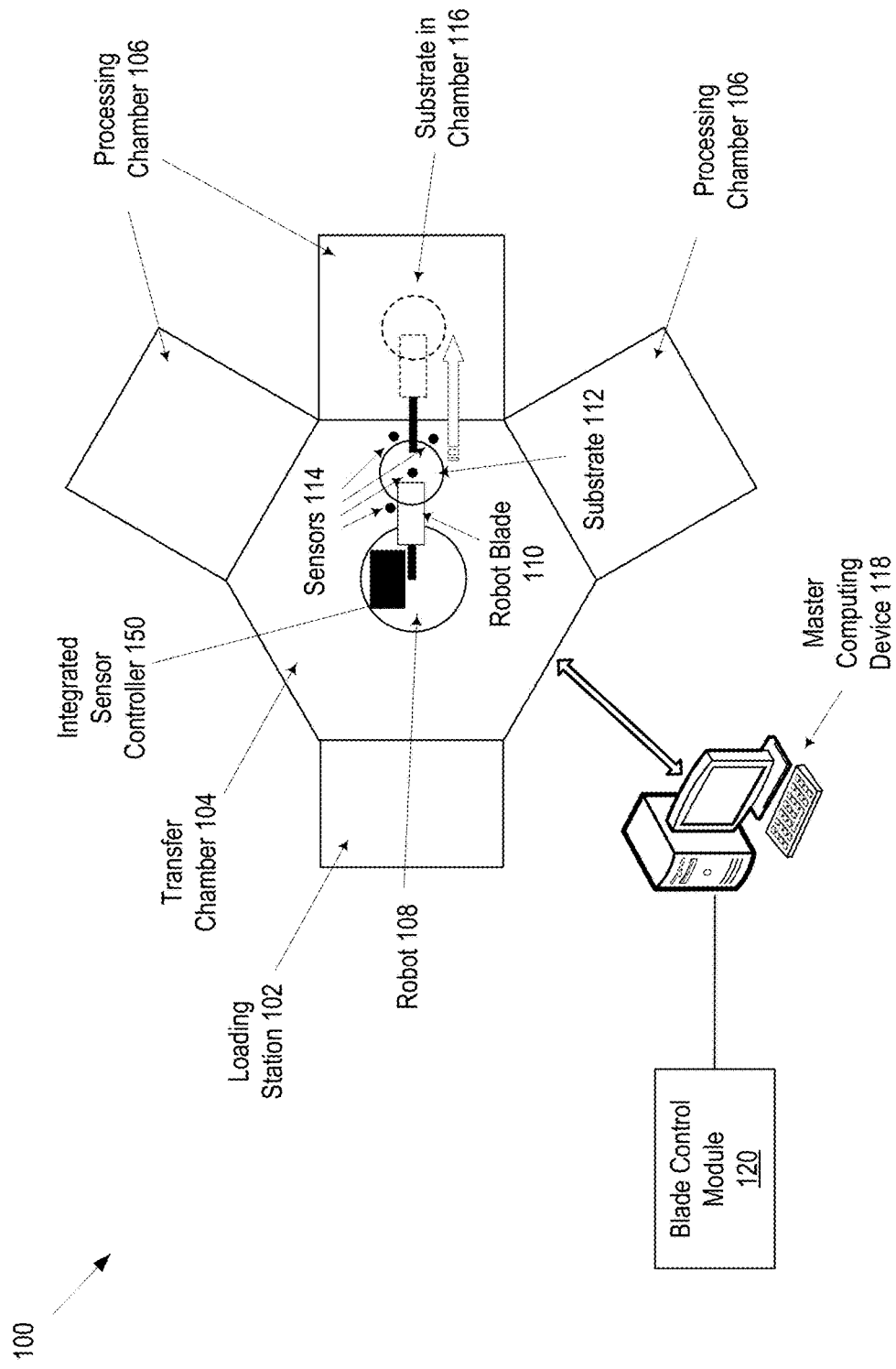
FIG. 1 illustrates one exemplary implementation of a manufacturing machine capable of supporting accurate optical sensing of substrates transported on a moving blade into a processing chamber.

The implementations disclosed herein provide for an integrated sensor controller for precision optical detection of substrate positioning while the substrates are being transferred to or between processing chambers (which may include deposition chambers, etching chambers, plasma chambers, and so on). For example, the implementations disclosed helps to accurately determine positioning of a substrate on a robot blade and provide data for a controller of the robot blade to correct or compensate for a misplacement of the substrate before the substrate is delivered to a destination location.

The robotic systems allow a quick and efficient delivery of substrates for processing into processing chambers and an automated retrieval of the processed substrates from the processing chambers. Robotic delivery/retrieval systems greatly increase a yield of the manufacturing process but pose some specific quality control challenges. As the substrate is being picked up (e.g., from a substrate carrier, such as a front opening unified port) by the robot blade and transported through a factory (front-end) interface, load-lock chamber, transfer chamber, etc., to one of the processing chambers of a device manufacturing machine, the substrate's position on the blade may be different from an ideal location relative to the blade and may lead to an incorrect positioning of the substrate delivered into the processing chamber. This may result in sub-standard physical and/or chemical properties of the eventual product (e.g., an incorrect placement of dopants on the substrate, a non-uniform thickness of a film deposited on the surface of the substrate, and the like). To improve quality of the product yield, a system of optical sensors connected to a microcontroller may be used so that exact moments of time when the substrate (or its edge) arrives at a specific point in space are determined. Based on a difference between the actual arrival time and an (ideal) reference arrival time, for a number of such specific points in space, the microcontroller can determine the actual position (e.g., shift and angular misalignment) of the substrate on the robot blade. Subsequently, a blade control module can determine what corrective action (e.g., a compensating change of the blade's trajectory) may be performed to compensate for the error in the substrate positioning.

In one embodiment, the optical sensors operate by outputting a light signal and detecting a precise moment of time when an event associated with the output light occurs. Such an event may be an instance when the output light is reflected off the arrived substrate and into a detector of light, in some implementations. In other implementations, the output light may be continuously incident on the detector but occluded by the arrived substrate, and so on. The light output by a sensor and detected by a light detector may undergo processing by an optical amplifier. In existing implementations, a dedicated amplifier is typically associated with each separate sensor. Each amplifier may, therefore, require separate tuning and maintenance. This increases costs of optical detectors. Each separate optical amplifier circuit (and an associated optical path of the optical signal) may have its own detection delay time (the time it takes for optical and electric circuits to detect and process the event) or even its own distribution of delay times. The distributions for each amplifier circuit may be centered at different values of the delay time and may have different widths. In various devices the resulting overall distribution of delay times may be rather broad, e.g., 30 microseconds, or even more.

Aspects and implementations of the present disclosure address this and other technological shortcomings by improving tunability, consistency, and accuracy of the optical sensing technology used in substrate processing. Described herein is an integrated optical sensing controller in which an optical amplifier, as well as other optical circuitry (e.g., a light emitting diode (LED) driver, one or more optical (de)multiplexers, an analog-to-digital converter, etc.), is able to support multiple optical sensors. Further disclosed is software-implemented configurability of the optical circuitry using a microcontroller integrated with the optical circuitry. Such integrated—into a single assembly—optical circuits, analog electronics and digital electronics reduce system costs, improve accuracy of optical sensing and allow real time software control. This alleviates or eliminates manual calibration and maintenance of the optical amplifiers in the conventional sensing devices which feature separate amplifiers serving separate sensors.

FIG. 1 illustrates one exemplary implementation of a manufacturing machine 100 capable of supporting accurate optical sensing of substrates 112 transported on a moving blade into a processing chamber 106 (as schematically depicted with the substrate's position in chamber 116) and/or out of a processing chamber 106. Embodiments described with regards to optical sensing of substrates entering or leaving a processing chamber also apply to optical sensing of substrates entering or leaving a loading station (e.g., load lock) and/or other station. In one implementation, the manufacturing machine 100 includes a loading station 102, a transfer chamber 104, and one or more processing chambers 106. The processing chamber(s) 106 are interfaced to the transfer chamber 104 via transfer ports (not shown) in some embodiments. The number of processing chamber(s) associated with the transfer chamber 104 may vary (with three processing chambers indicated in FIG. 1, as a way of example). Additionally, the design and shape of the transfer chamber 104 may vary. In the illustrated embodiment, the transfer chamber 104 has a hexagonal shape with each side being of approximately equal width. In other embodiments, the transfer chamber 104 may have four, five, seven, eight, or more sides. Additionally, different sides may have different widths or lengths. For example, the transfer chamber 104 may have four sides and be of rectangular shape or of square shape. In another example, the transfer chamber may have five sides and be of a wedge shape. As shown, each side of the transfer chamber 104 is connected to a single processing chamber 106. However, in other implementations one or more of the sides may be connected to multiple processing chambers. For example, a first side may be connected to two processing chambers, and a second side may be connected to one processing chamber.

Substrate 112 can be a silicon wafer (e.g., a crystalline or amorphous silicon wafer), a glass wafer, a film or a stack of films, a wafer package, such as a thinned wafer on a carrier, and the like. In some implementations, substrate 112 can be a process kit component, e.g., an edge ring or any other replaceable component of the manufacturing machine. Substrate 112 can be a diagnostic device, such as an optical inspection tool, introduced into a processing chamber (a load-lock chamber, or any other part of the manufacturing machine) for inspection, replacement, and/or maintenance.

The transfer chamber 104 includes a robot 108, a robot blade 110, and an optical sensing tool for accurate optical sensing of a positioning of a substrate 112 that is being transported by the robot blade 110 for processing in one of the processing chambers 106. An optical sensing tool may additionally or alternatively be positioned for optical sensing of a positioning of a substrate 112 that is being transported by the robot blade 110 into or out of loading station 102 and/or other processing chambers 106. The transfer chamber 104 may be held under pressure that is higher or lower than atmospheric pressure. For example, the transfer chamber 104 may be maintained under vacuum. Additionally, or alternatively, the transfer chamber 104 may be maintained at an elevated temperature in some embodiments. The robot blade 110 may be attached to an extendable arm sufficient to move the robot blade 110 into the processing chamber 106 to deliver the substrate to the chamber prior to processing and to retrieve the substrate from the chamber after the processing is complete.

The robot blade 110 is configured to enter the processing chamber(s) 106 through a slit valve port (not shown) while a lid to the processing chamber(s) 106 remains closed. The processing chamber(s) 106 may contain processing gases, plasma, and various particles used in deposition processes. A magnetic field may exist inside the processing chamber(s) 106. The inside of the processing chamber(s) 106 may be held at temperatures and pressures that are different from the temperature and pressure outside the processing chamber(s) 106.

The manufacturing machine 100 includes an integrated sensor controller (ISC) 150, which may be coupled to multiple sensors 114. Each sensor 114 includes a sensor head to output a light signal. In some implementations, the sensor heads include light-emitting diodes (LEDs). In some implementations, the sensor heads are ends of optical fibers that deliver light generated elsewhere, e.g., inside the ISC 150. Each sensor 114 includes a light detector to detect light output by the respective sensor head. In some implementations, the light detectors are optical detectors configured to deliver received (RX) optical signals to ISC 150. For example, some or each of the optical detectors may be ends of optical fibers connected to ISC 150. In other implementations, the light detectors are photoemission detectors configured to deliver electric signals to ISC 150. The light delivered (TX) to optical heads may be in the visible range, infrared range, ultraviolet range, or any other range of electromagnetic radiation suitable for the task of sensing a substrate position. In some implementations, the sensors 114 are mounted on the door of the transfer chamber 104, inside the transfer chamber 104, inside of a slit valve assembly, inside of a load port, inside the loading station 102, and/or inside any one of the processing chambers 106.

A master computing device 118 may control operations of the robot 108 and may also receive optical sensing data from ISC 150, including processed information derived from the data obtained by the sensors 114. In some implementations, the master computing device 118 reconfigures ISC 150 at run time. In some implementations, communication between the master computing device 118 and the ISC 150 is performed wirelessly. The master computing device 118 may include a blade control module 120. The blade control module may be capable of correcting, based on the information obtained from the ISC 150, the position of the substrate 112 on the robot blade 110, e.g., to determine if the position is outside the tolerances of a manufacturing process. In some implementations, some of the functionality of the blade control module 120 is implemented as part of the ISC 150.

Figure 2:
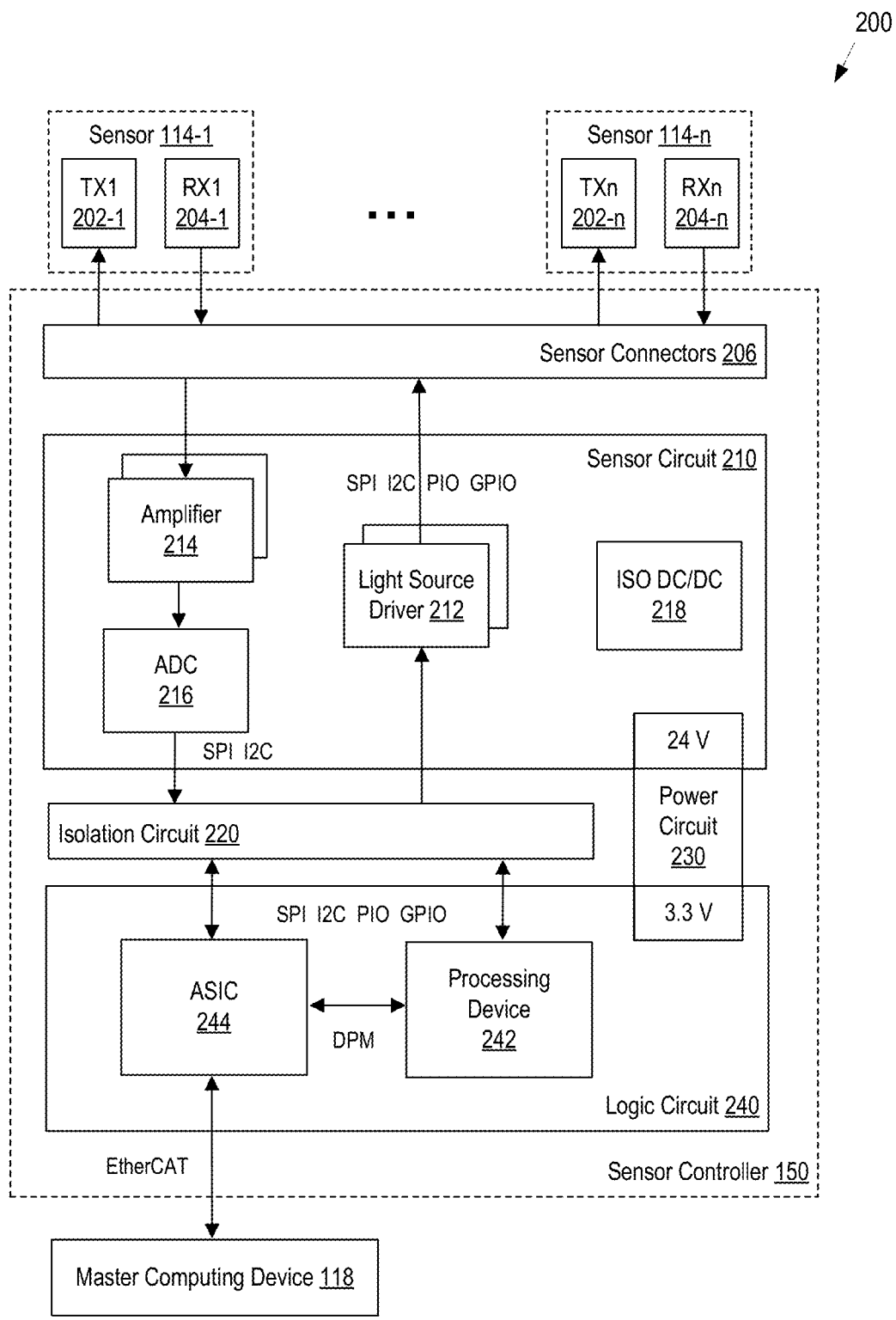
FIG. 2 illustrates an exemplary integrated circuit architecture capable of providing precision optical detection of substrate positioning prior, during, or after substrate transportation to or from a processing chamber, in accordance with some implementations of the present disclosure.

FIG. 2 illustrates an exemplary integrated circuit architecture 200 capable of providing precision optical detection of substrate positioning prior, during, or after substrate transportation to or from a processing chamber, in accordance with some implementations of the present disclosure. The integrated circuit architecture 200 includes a number of sensors 114 (numbered from 114-1 to 114-n, wherein n is the number of sensors), sensor connectors 206, a sensor circuit 210, an isolation circuit 220, and/or a logic circuit 240. In some implementations, the sensor connectors 206, the sensor circuit 210, the isolation circuit 220, and the logic circuit 240 are integrated as a single system-on-chip (SoC) sensor controller. The sensor circuit 210 may include one or more light source drivers 212, such as LED drivers. An LED driver may regulate an amount of electric power delivered to the sensors 114. The electric signals generated by the light source driver(s) 212 may be selectively routed to the sensors 114 via a block of sensor connectors 206. The block of sensor connectors 206 are programmable by the logic circuit 240 and/or the master computing device 118 in embodiments. Specifically, the block of sensor connectors 206 may include a set of switches. In some implementations, the logic circuit 240 has a number of pre-set configurations of switches to be selected depending on the processing task being implemented, such as delivering an unprocessed substrate to a processing chamber, transferring a partially processed substrate between different processing chambers, retrieving a fully processed chamber, and the like.

In some implementations, the optical drivers output optical (rather than electric) signals to the sensors 114. In such implementations, the block of sensor connectors 206 include a set of optical connectors and switches to deliver a preconfigured amount of optical power to each (or some) of the sensors 114. For example, the sensor connectors 206 may include one or more demultiplexers to split a driving (optical or electric) signal produced by one or more of the light source drivers 212 and deliver each one of the split signals to the respective sensor head.

The sensor heads 202-1 . . . 202-n output respective optical signals (TX) in an embodiment. The light detectors 204-1 . . . 204-n may receive signals (RX) output by the respective sensor heads 202. In some implementations, the RX signals are generated by the respective TX signals upon reflection from the surface of the substrate 112. In other implementations, the RX signals are TX signals propagated (over air) from sensor heads 202 to light detectors 204. Each of the light detectors 204 may be capable of detecting an event associated with propagation of light from the sensor head 202. Such events may be associated with reflection of light from the substrate, termination of the TX signal detection due to occlusion by the substrate, restoration of the TX signal detection due to departure of the substrate, and so on. In some implementations, the RX signals generated by the light detectors 204 are optical signals. For example, the RX signals may represent an amount of light emitted through an end of a first optical fiber (sensor head 202) and subsequently recaptured through an end of a second optical fiber (light detector 204). In some implementations, the RX signals are electric signals generated by a photoelectric element (within a light detector 204) under the influence of the incident optical TX signals.

The RX signals may be received and processed by one or more amplifiers 214. In some implementations, a single amplifier 214 receives RX signals from all sensors 114. In some implementations, multiple amplifiers 214 receive RX signals, with some or all of the amplifiers 214 receiving RX signals from multiple sensors 114. In those implementations, where light detectors 204 are photoelement-based detectors, the amplifiers 214 are electronic amplifiers. In those implementations where light detectors 204 are optical detectors, the amplifiers 214 are optical amplifiers. In the latter case, the sensor circuit 210 may include additional components to transform optical RX signals to electric signals. The amplified, by the amplifier(s) 214, RX signals may be further processed by an analog-to-digital converter (ADC) 216.

Digital signals output by the ADC 216 are received by the logic circuit 240 in embodiments. The signals may be received by the logic circuit 240 via an isolation circuit 220. The isolation circuit may prevent backpropagation of electric signals from the logic circuit 240 to the sensor circuit 210 and/or further to the sensors 114 to prevent spurious noises of the logic circuit 240 from affecting accuracy of optical sensing including preparation of TX signals, detecting and processing of the RX signals. The logic circuit 240 may perform processing of data received from the sensor circuit 210 as well as providing configurable functionality of the sensor circuit 210. The logic circuit 240 may include a processing device 242, e.g., a field programmable gate array (FPGA), or some other processor. The logic circuit 240 may further include an integrated circuit 244 to facilitate communication between the sensor controller 150 and outside computing devices, such as the master computing device 118 or other computing devices on the same network to which the sensor controller 150 may be connected. The integrated circuit 244 is an application-specific integrated circuit (ASIC) 244 in some embodiments. In some implementations, the sensor controller 150 communicates, via appropriate ASIC 244, with the master computing device 118 (or other network computing devices) using an EtherCAT data exchange protocol. In some implementations, the sensor controller 150 communicates with the master computing device 118 using some other fieldbus protocols. For example, the sensor controller 150 may communicate, via ASIC 244, with the master computing device 118 using AS-Interface, Interbus, Profibus, or any other suitable fieldbus protocol. The ASIC 244 may be configurable and may be customized to define the profile of the sensor controller 150 (e.g., as a node on the EtherCAT network) to determine how the sensor controller 150 exchanges data with the master node of the network (e.g., the master computing device 118), depending on the functionality currently provided by the sensor controller 150.

The processing device 242 (e.g., an FPGA or any other processor) may include hardware (an array of logic gates and one or more memory devices) and software to set up and control operations of the sensor circuit 210 and sensors 114. The processing device 242 may be fully customizable. Upon powering-up, the processing device 242 may implement a default configuration of the sensor circuit 210, including configuring the light source drivers 212 and the amplifiers 214. During operations of the sensor controller 150, the processing device 242 may receive data generated by the sensors 114, processed and digitized by the sensor circuit 210. The processing device 242 may output information to the master computing device 118 representative of the position of the substrate 112 on the robot blade 110. Depending on a processing task being implemented (e.g., delivery of a substrate into a specific processing chamber or transfer between specific processing chambers), the processing device 242 may be reconfigured during run time ("on the fly") using various pre-set configurations stored in a memory accessible to the processing device 242. For example, based on the processing task being a delivery of the substrate into a chemical vapor deposition chamber, the master computing device 118 may communicate (via ASIC 244) to the processing device 242 an instruction to reconfigure the sensor controller 150 into a first pre-set configuration corresponding to substrate delivery to the vapor deposition chamber. As another example, at a later time, when the substrate is being transferred for processing in a plasma environment of an etching chamber, the master computing device 118 may communicate to the processing device 242 another instruction to reconfigure the sensor controller 150 into a second pre-set configuration corresponding to substrate delivery to the etching chamber.

The sensor controller 150 may be equipped with a power source, which in some implementations may include a power circuit 230 such as an ISO DC/DC power converter. In some implementations, the power converter converts a 12V or 24V (used by the sensor circuit 210) power signal into a 3.3V power signal used by the logic circuit 240. In other implementations, different input and output voltages may be used. In some implementations, the power converters may be bidirectional converters.

Various components shown in FIG. 2, communicate via a number of communication interfaces and protocols (as indicated schematically in FIG. 2), such as the synchronous serial peripheral interface (SPI) is a serial communication interface, the $I^2C$ serial bus, peripheral input/output (PIO) interface, general purpose input/output (GPIO) interface, dual-port memory interface (DPM), and so on.

The integrated circuit illustrated in FIG. 2 is capable of generating data and providing inputs about substrates (e.g., wafers), process kits, diagnostic tools, and any other objects delivered to or already present inside various chambers of the manufacturing machine 100. For example, the integrated circuit may provide various characteristics of different types of processed and unprocessed wafers, films, combinations of wafers and/or films, and the like. The characteristics can include position (including presence or absence,) size, orientation, uniformity, thickness, chemical, physical and optical properties, and the like. Additionally, the integrated circuit may provide data about a variety of algorithms for delivery and/or handling of substrates (or other objects delivered into the processing chambers).

In addition to generating data to accurately place a substrate into a process chamber, the integrated circuit controller illustrated in FIG. 2 can be extended/adapted to provide sensor inputs to the substrate handling control system for automated substrate handling calibration, in situ substrate handling monitoring and diagnostics, and other similar functions where the sensors may detect the robot body and/or select features with vertical, horizontal, or angled beams.

Figure 3:
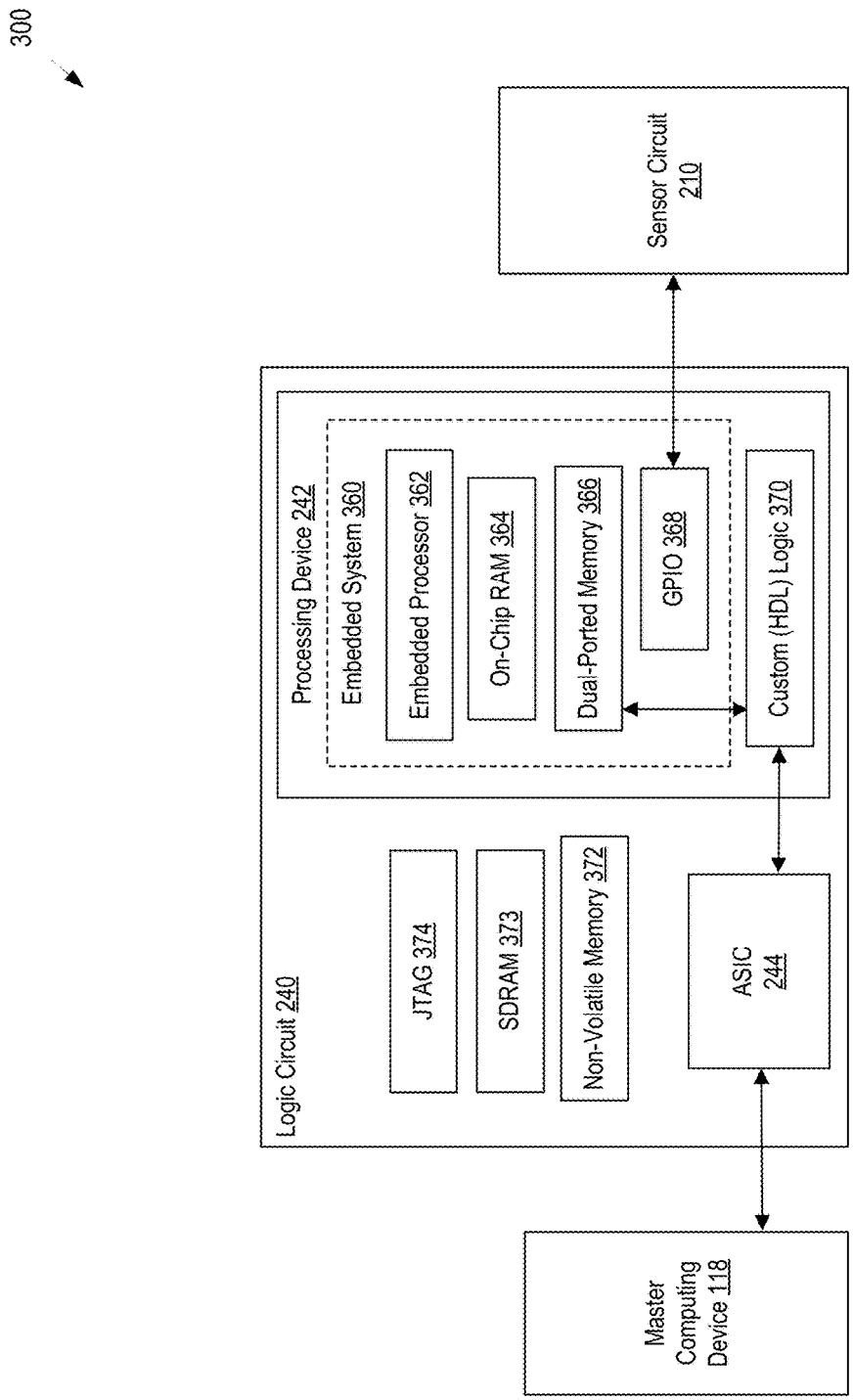
FIG. 3 illustrates an exemplary architecture of the logic circuit of the integrated sensor controller capable of providing precision optical detection of substrate positioning, in accordance with some implementations of the present disclosure.

FIG. 3 illustrates an exemplary architecture of the logic circuit 240 of the integrated circuit architecture 200 capable of providing precision optical detection of substrate positioning, in accordance with some implementations of the present disclosure. The logic circuit 240 includes a processing device 242 (e.g., an FPGA) that may use various integration technologies to implement an embedded system 360. The embedded system 360 integrates an embedded processor 362 in an embodiment, which may be a hard-core (e.g., ARM® SoC) or a soft-core (e.g. Nios®) processor. The embedded system 360 may further include an on-chip random access memory (RAM) 364, a dual-ported memory 366 for fast memory operations, a general-purpose input-output (GPIO) module 368, as well as other components not explicitly depicted (e.g., system clock). The embedded system 360 may be coupled to a custom logic 370, a non-volatile memory 372 (e.g., serial flash memory or any other type of non-volatile memory), and a synchronous random-access memory (SDRAM) 373. The embedded system 360 may be coupled to JTAG interface 374 for programming and debugging.

Before the sensor controller 150 is powered up, the software for the embedded processor 362 and configuration files for the processing device 242 initially reside in the non-volatile memory 372. During boot-up, the software stored in the non-volatile memory 372 is used to configure the processing device 242 to instantiate the embedded system 360 and custom HDL logic 370. Then the embedded processor 362 in the embedded system 360 fetches the controller software from the non-volatile memory 372, and starts the application logic for the embedded system 360. The application and the libraries may be written to external memory, such as synchronous dynamic RAM (SDRAM) 373 (or the on-chip RAM 364). The custom logic 370 may be a software component that implements application-specific functionality of the sensor controller 150. The custom logic 370 may be written in a programming language (e.g., C or C++) and converted (using an appropriate compiler) into a hardware-description language (HDL).

During operations of the sensor controller 150, the data received from the sensor circuit 210 may be processed by the custom logic 370 or the embedded processor 362 and communicated to the master computing device 118 via the ASIC 244. The data communicated by the custom logic 370 may include (but not be limited to) some of the following: indications of events associated with the TX and/or RX output/detected by sensors 114 (e.g., arrival or departure of the substrate), including exact types of the events detected, indications of times when the detected events occurred, identification of the channels (e.g., of the specific sensors 114) used to detect the events, and the like. In some implementations, when a reconfiguration (reprogramming) instruction received from the master computing device 118 is received by the ASIC 244, the ASIC 244 may send instructions to the embedded processor 362 to reconfigure the application stored in on-chip RAM 364 or SDRAM 373 to change one or more settings of the application (e.g., to reflect a new type of a task executed by the robot 108 or new parameters for detecting events by sensors 114). In some implementations, when a reconfiguration (reprogramming) instruction received from the master computing device 118 is received by the ASIC 244, the ASIC 244 may reconfigure registers in the dual-ported memory 366 directly to change settings of the application.

Figure 4:
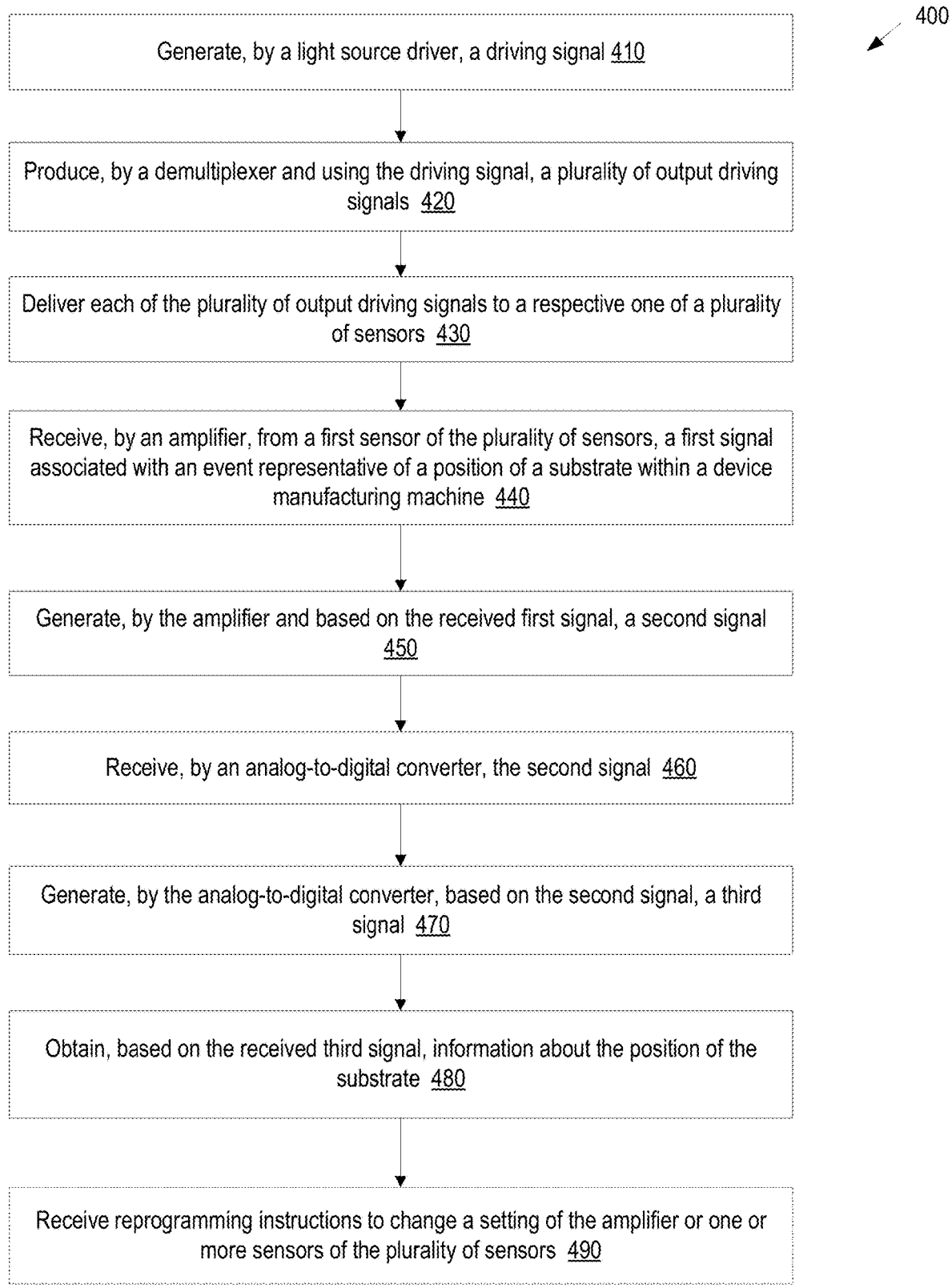
FIG. 4 is a flow diagram of one possible implementation of a method of accurate optical sensing of positioning of substrates transported by a moving blade, in accordance with some implementations of the present disclosure.

FIG. 4 is a flow diagram of one possible implementation of a method 400 of accurate optical sensing of positioning of substrates transported by a moving blade, in accordance with some implementations of the present disclosure. Method 400 may be performed using systems and components shown in FIGS. 1-3 or any combination thereof. Method 400 may be performed by the integrated sensor controller 150. Some of the blocks of method 400 may be optional. Some or all blocks of the method 400 are performed responsive to instructions from the processing device 242 of the sensor controller 150, in some implementations. In some implementations, some or all of the blocks of method 400 are performed responsive to instructions from the master computing device 118, e.g., one or more processing devices (e.g. central processing units) of the master computing device 118 coupled to one or more memory devices. Method 400 may be performed while the manufacturing system (such as the manufacturing machine 100) is performing a production process on multiple substrates. In some implementations, the method 400 may be implemented when a substrate is being transported to or from the processing chamber, the load-lock chamber, the transfer chamber, and the like, by a robot blade of a robot, for example while the robot blade 110 is transporting the substrate from the loading station 102 through the transfer chamber 104 and towards the processing chamber 106. For example, the robot 108 may extend the robot blade 110 from the transfer chamber 104 into the loading station 102 and deliver (through a transfer port) the substrate for processing (position 116) to the processing chamber 106. The robot blade 110 may subsequently withdraw back into the transfer chamber 104. The precision optical detection of substrate positioning may be performed while the substrate is inside the loading station 102, while the substrate is inside the transfer chamber 104, and/or while the substrate is inside the processing chamber 106. The precision optical detection of substrate positioning may be performed while the robot blade 110 implements a standard delivery or retrieval procedure, without slowing down the robot blade's motion. Accordingly, the precision optical detection of substrate positioning may be performed without delaying the manufacturing process.

The method 400 may involve the integrated sensor controller 150 (alone or in communication with the master computing device 118) generating, e.g., by one or more light source drivers, a driving signal (block 410). The light source drivers may be optical drivers (e.g., drivers generating light signals) or electric drivers (e.g., drivers generating electric signals to be delivered to light sources powered by electricity). Correspondingly, the optical or electric driving signals may be used to produce (e.g., by an optical or electronic demultiplexer) a plurality of output driving signals (block 420).

Method 400 may continue with delivering each of the plurality of output driving signals to a respective one of a plurality of sensors (block 430). For example, the output driving signals may be delivered to one or more sensor heads 202. Method 400 may further include receiving (e.g., by the amplifier 214), one or more first signals from one or more sensors (e.g., from light detectors 204) associated with various optical events representative of a position of a substrate within a device manufacturing machine (block 440). Such events may include a direct light from a sensor head 202 striking a light detector 204, the direct light being shielded (occluded) from the light detector by the substrate. Such events may further include a light reflected by (or transmitted through) the substrate striking (or being shielded from) the light detector, or any other optical event representative of the position of the substrate. In some implementations, the first signals may be optical signals (e.g., corresponding to light captured by optical fiber detectors 204). In some implementations, the first signals may be electric signals (e.g., corresponding to signals produced by photodetectors 204).

Method 400 may continue with generating (e.g., by the amplifier 214) and based on the received first signal(s), one or more second signals (block 450). The second signals may be amplified first signals and may be of the same type as the first signals. For example, in those implementations, where the first signals are optical signals, the amplifiers 214 may be optical amplifiers and the generated second signals may likewise be optical signals. In those implementations, where the first signals are electric signals the amplifiers 214 may be electric signal multipliers and the generated second signals may be electric signals. In some implementations, where the first signal are optical signals, the amplifiers 214 may be optical amplifiers but may additionally include optical-to-electric signal converters, so that the generated second signals may be electric signals.

At block 460, the generated second signals may be received by an analog-to-digital converter (e.g., ADC 216), which (at block 470), may generate, based on the second signals, one or more third signals. The generated third signals may be received by the processing device (e.g., the processing device 242). In some implementations, the third signals may be transmitted through an isolation circuit 220 configured to prevent noise and other spurious signals from the logic circuit 240 from affecting the circuitry of the sensor circuit 210. At block 480, the third signals may be used by the processing device to obtain information about the position of the substrate. The processing device may be able to extract, from the third signals, the data indicative of (one or more) underlying optical events, such as the type of the event (e.g., light incidence, occlusion, reflection, transmission, and the like), the timing of the event, the channel (e.g., the identity of the sensor that detected the event) the location of the event (e.g., based on the known location of the identified sensor), and so on. Based on this data, the processing device may obtain information about the exact location of the substrate relative to the robot blade. In some implementations, such information may be obtained based, in part, on the known location (and dynamics) of the robot blade, which may be obtained from the blade control module 120 residing on the master computing device 118, or some other computing device available on the network (e.g., EtherCAT network).

In some implementations, method 400 may continue with the processing device providing the information about the position of the substrate to the master computing device 118 (or to another computing device hosting the blade control module 120) so that the blade control module can compensate for the error in the substrate positioning, e.g., by adjusting the trajectory of the blade so that the substrate arrives at its intended correct destination.

In some implementations, method 400 may include receiving, by the processing device, reprogramming instructions to change a setting of one of the circuits or elements of the sensor circuit 210, such as the amplifier 214, one or more light source drivers 212, and/or one or more sensors 114.

Figure 5:
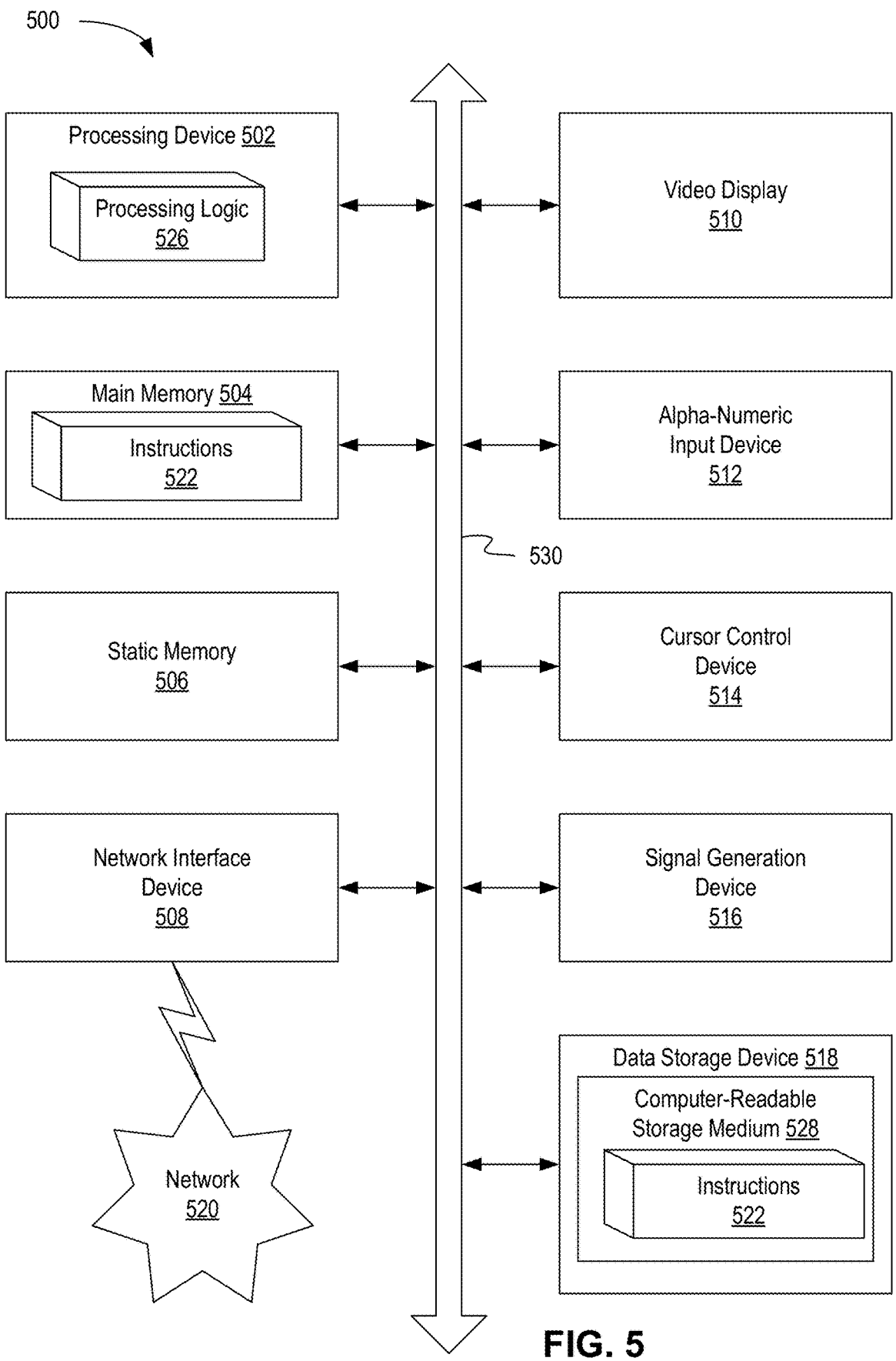
FIG. 5 depicts a block diagram of an example processing device operating in accordance with one or more aspects of the present disclosure and capable of accurate optical sensing of substrates transported on a moving blade into a processing chamber, in accordance with some implementations of the present disclosure.

FIG. 5 depicts a block diagram of an example processing device 500 operating in accordance with one or more aspects of the present disclosure and capable of accurate optical sensing of substrates transported on a moving blade into a processing chamber, in accordance with some implementations of the present disclosure. The processing device 500 may be the computing device 118 of FIG. 1A or a microcontroller 152 of FIG. 1B, in one implementation.

Example processing device 500 may be connected to other processing devices in a LAN, an intranet, an extranet, and/or the Internet. The processing device 500 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 500 may include a processor 502 (e.g., a CPU), a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory (e.g., a data storage device 518), which may communicate with each other via a bus 530.

Processor 502 represents one or more general-purpose processing devices such as a microprocessor, central processing unit, or the like. More particularly, processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 502 may be configured to execute instructions implementing method 400 of accurate optical sensing of positioning of substrates transported by a moving blade.

Example processing device 500 may further comprise a network interface device 508, which may be communicatively coupled to a network 520. Example processing device 500 may further comprise a video display 510 (e.g., a liquid crystal display (LCD), a touch screen, or a cathode ray tube (CRT)), an alphanumeric input device 512 (e.g., a keyboard), an input control device 514 (e.g., a cursor control device, a touch-screen control device, a mouse), and a signal generation device 516 (e.g., an acoustic speaker).

Data storage device 518 may include a computer-readable storage medium (or, more specifically, a non-transitory computer-readable storage medium) 528 on which is stored one or more sets of executable instructions 522. In accordance with one or more aspects of the present disclosure, executable instructions 522 may comprise executable instructions implementing method 400 of accurate optical sensing of positioning of substrates transported by a moving blade.

Executable instructions 522 may also reside, completely or at least partially, within main memory 504 and/or within processing device 502 during execution thereof by example processing device 500, main memory 504 and processor 502 also constituting computer-readable storage media. Executable instructions 522 may further be transmitted or received over a network via network interface device 508.

While the computer-readable storage medium 528 is shown in FIG. 5 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A sensor controller comprising:
   a sensor circuit comprising:
   a light source driver to generate a driving signal;
   a demultiplexer to produce, using the driving signal, a plurality of output driving signals, wherein each of the plurality of output driving signals is to be delivered to one of a plurality of sensors;
   an amplifier coupled to each of the plurality of sensors, the amplifier to:
   receive a first signal from a first sensor of the plurality of sensors, wherein the first signal is associated with a first event representative of a positioning of a substrate within a device manufacturing machine; and
   generate, based on the received first signal, a second signal; and
   an analog-to-digital converter to receive the second signal and generate, based on the second signal, a third signal; and
   a logic circuit comprising:
   a memory device storing instructions; and
   a processing device coupled to the memory device, wherein the processing device is to obtain, using the stored instructions and based on the third signal, information about the positioning of the substrate within the device manufacturing machine.

2. The sensor controller of claim 1, wherein the positioning of the substrate within the device manufacturing machine is relative to a robot blade used to transport the substrate within the device manufacturing machine.

3. The sensor controller of claim 1, wherein each of the plurality of sensors comprises a light-emitting diode (LED), the light source driver comprises an LED driver, and the driving signal comprises an electric signal.

4. The sensor controller of claim 3, wherein the demultiplexer comprises an electronic demultiplexer.

5. The sensor controller of claim 1, wherein the driving signal comprises an optical signal, and wherein each of the plurality of output driving signals is delivered to a respective sensor of the plurality of sensors via an optical fiber.

6. The sensor controller of claim 1, wherein the demultiplexer comprises an optical demultiplexer.

7. The sensor controller of claim 1, wherein the first sensor of the plurality of sensors comprises:
   a sensor head to output a light signal driven by a respective output driving signal of the plurality of output driving signals; and
   a light detector to detect the light signal output by the sensor head and to generate the first signal associated with the first event representative of the positioning of the substrate.

8. The sensor controller of claim 7, wherein the sensor head comprises an output optical fiber, and wherein the light detector comprises an input optical fiber.

9. The sensor controller of claim 7, wherein the light detector comprises a photoelectric element, and wherein the first signal is produced by the photoelectric element.

10. The sensor controller of claim 1, wherein the processing device comprises a field programmable gate array (FPGA) and a custom logic, the custom logic comprising a software component configured to obtain the information about the positioning of the substrate based on the third signal.

11. The sensor controller of claim 10, further comprising a dual-ported memory device to store the software component when the sensor controller is powered-up.

12. The sensor controller of claim 1, wherein the logic circuit further comprises an application-specific integrated circuit to identify the sensor controller to an outside network.

13. The sensor controller of claim 12, wherein the outside network comprises a master computing device, and wherein the information about the positioning of the substrate is to be output to the master computing device.

14. The sensor controller of claim 13, wherein the sensor controller is reprogrammable by the master computing device.

15. The sensor controller of claim 1, wherein the sensor circuit is to:
- receive a fourth signal from a second sensor of the plurality of sensors, wherein the fourth signal is associated with a second event representative of the positioning of the substrate; and
- generate a fifth signal based on the received fourth signal; and
- wherein the information about the positioning of the substrate obtained by the processing device is further based on the fifth signal.

16. A method comprising:
- generating, by a light source driver, a driving signal;
- producing, by a demultiplexer and using the driving signal, a plurality of output driving signals;
- delivering each of the plurality of output driving signals to a respective one of a plurality of sensors;
- receiving, by an amplifier, from a first sensor of the plurality of sensors, a first signal associated with an event representative of a positioning of a substrate within a device manufacturing machine;
- generating, by the amplifier and based on the received first signal, a second signal;
- receiving, by an analog-to-digital converter, the second signal;
- generating, by the analog-to-digital converter and based on the second signal, a third signal; and
- obtaining, by a processing device and based on the third signal, information about the positioning of the substrate within the device manufacturing machine.

17. The method of claim 16, further comprising:
- providing, by the processing device, the information about the positioning of the substrate to a master computing device.

18. The method of claim 16, further comprising:
- receiving, by the processing device, reprogramming instructions to change a setting of the amplifier, a light source driver, or one or more sensors of the plurality of sensors.

19. A non-transitory computer readable medium storing instructions thereon that when executed by a processing device cause a sensor controller to:
- generate, by a light source driver, a driving signal;
- produce, by a demultiplexer and using the driving signal, a plurality of output driving signals;
- deliver each of the plurality of output driving signals to a respective one of a plurality of sensors;
- receive, by an amplifier, from a first sensor of the plurality of sensors, a first signal associated with an event representative of a positioning of a substrate within a device manufacturing machine;
- generate, by the amplifier and based on the received first signal, a second signal;
- receive, by an analog-to-digital converter, the second signal;
- generate, by the analog-to-digital converter, based on the second signal, a third signal; and
- obtain, based on the third signal, information about the positioning of the substrate within the device manufacturing machine.

20. The computer readable medium of claim 19, wherein the instructions are to cause the sensor controller to:
- provide the information about the positioning of the substrate to a master computing device.

21. The computer readable medium of claim 19, wherein the instructions are to cause the sensor controller to:
- receive reprogramming instructions to change a setting of the amplifier or one or more sensors of the plurality of sensors.

* * * * *